United States Patent [19]
Yamada et al.

[11] Patent Number: 6,034,323
[45] Date of Patent: Mar. 7, 2000

[54] SOLAR CELL MODULE

[75] Inventors: Satoru Yamada; Ichiro Kataoka, both of Kyotanabe; Hidenori Shiotsuka, Nara; Shigeo Kiso, Kyotanabe, all of Japan

[73] Assignee: Canon Kabushiki Kaisha, Tokyo, Japan

[21] Appl. No.: 09/024,863

[22] Filed: Feb. 17, 1998

[30]       Foreign Application Priority Data

Feb. 19, 1997   [JP]   Japan .................................... 9-035121

[51] Int. Cl.$^7$ .................................................. H01L 31/00
[52] U.S. Cl. ........................................... 136/259; 136/251
[58] Field of Search .................................. 136/251, 259

[56]                References Cited
             FOREIGN PATENT DOCUMENTS

| | | |
|---|---|---|
| 0 625 802 | 11/1994 | European Pat. Off. . |
| 0 747 971 | 12/1996 | European Pat. Off. . |
| 61-133674 | 6/1986 | Japan . |
| 4-349672 | 12/1992 | Japan . |
| 97/50131 | 12/1997 | WIPO . |

OTHER PUBLICATIONS

Patent Abstracts of Japan, vol. 017, No. 213 (E–1356), Apr. 26, 1993 (corresponding to JP 4–349672).

M. Izu et al., "Lightweight Flexible Rooftop PV Module", IEEE World Conf. on Photovoltaic Energy, Dec. 5, 1994, pp. 990–993.

*Primary Examiner*—Mark Chapman
*Attorney, Agent, or Firm*—Fitzpatrick, Cella, Harper & Scinto

[57]                ABSTRACT

The solar cell module of the present invention comprises a solar cell device sealed with a sealing material between a support member and a protective film, wherein at least one of the protective film and the sealing material covers the edge of the support member. The above structure can prevent the sealing material from peeling from the edge of the solar cell module. Also, it can prevent rust from occurring at the edge when the support member is a steel sheet. Further, it can prevent the peeling by a simpler step than in the case of use of the conventional protective member for prevention of peeling.

14 Claims, 7 Drawing Sheets

SOLAR CELL MODULE

BACKGROUND OF THE INVENTION

1. Field of the Invention

The present invention relates to a solar cell module in which a solar cell device is sealed with a sealing material between a support member and a protective film, to a constructional member integrated with the solar cell module, and to a sunlight-utilizing electric power generation apparatus formed by using the solar cell module.

2. Related Background Art

Figure 6:
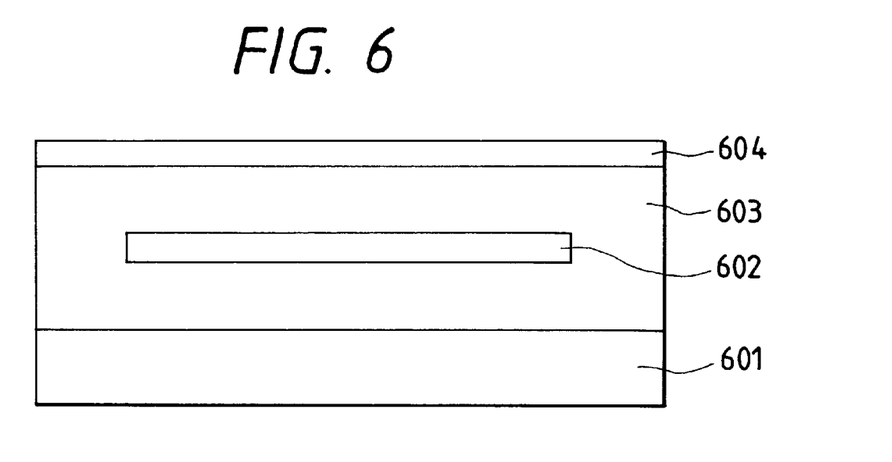
FIG. 6 is a cross-sectional view for a conventional solar cell module.

FIG. 6 shows an example of the conventional solar cell module. The conventional solar cell module is formed by sealing a solar cell device 602 with a resin 603 as a sealing material on a support member 601 such as a steel sheet and covering the top surface of the resin with a protective film 604.

Since the edge of the support member of the conventional solar cell module in such structure is exposed to the outside, the edges of the adhesion interface and the steel sheet are exposed to water or the like. This posed problems of exfoliation at the adhesion interface and rust appearing at the edge part of the steel sheet.

When the support member is a steel sheet having a coating film on the surface, the rust at the edge may induce peeling of the coating film from the steel sheet. This posed a problem that the occurrence of peeling of the coating film from the steel sheet caused peeling of the sealing material even when the adhesion strength was strong enough between the coating film and the sealing material.

Once the sealing material is peeled off in part, the peeling may spread in some cases. For example, when the solar cell modules as shown in FIG. 6 are used as a roof member and when the peeling appears on the eave side of roof, the peeling may proceed because of force of wind or the like. On the other hand, when the peeling occurs on the ridge side, the peeling may proceed because of rainwater or the like. It is difficult to prevent these peelings.

Figure 7:
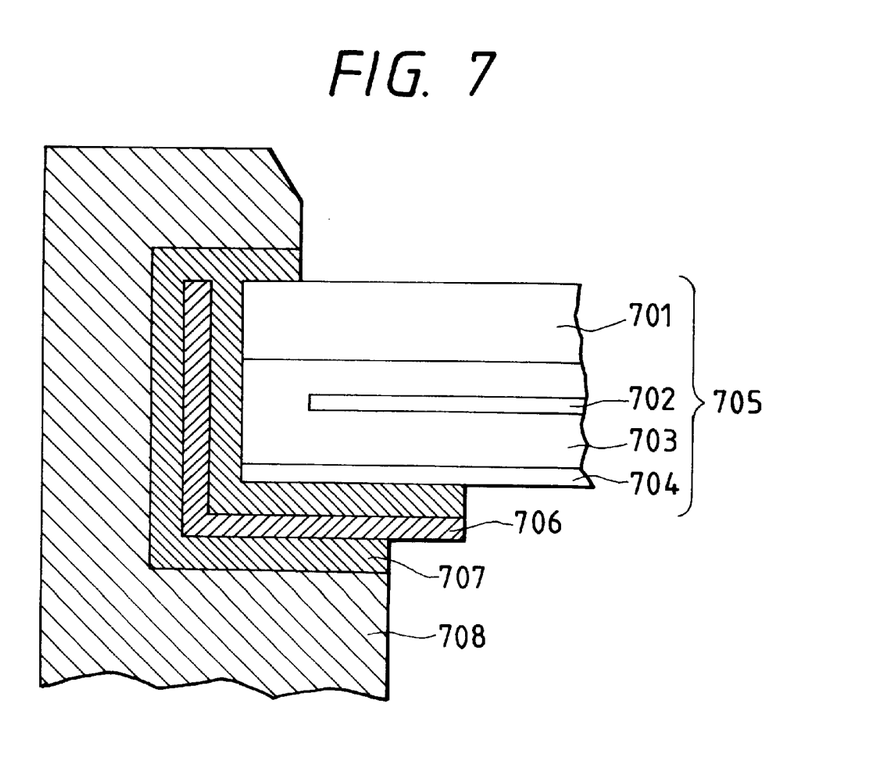
FIG. 7 is a schematic, structural view for showing a conventional solar cell module and an edge-peeling preventing member.

For example, Japanese Patent Application Laid-open No. 61-133674 discloses such an arrangement that a protective member is attached to the edge as mentioned above in order to prevent the peeling and rust at the edge. In this arrangement, as shown in FIG. 7, an adhesive 707 is applied to the edge of a solar cell module 705, a protective member 706 is bonded thereto, and a frame 708 is further bonded thereto with the adhesive 707. Reference numeral 701 designates a support member, 702 a solar cell device, 703 a resin, and 704 a back film. This method exhibits the great effect to suppress the peeling of the sealing material and the great effect to suppress the progress of peeling. This method, however, is inferior in productivity because it requires the steps of applying the adhesive, fitting the frame and/or the protective member, and curing the adhesive.

When the steel sheet is used as the support member, the rust at the edge of the steel sheet cannot be prevented without proper selection of the adhesive and applying method. The adhesive used for adhesion between the edge of solar cell module and a peeling preventing member is required to have weather resistance, flexibility, and so on. Adhesives satisfying such requirement are those of silicone resin or epoxy resin, either of which is expensive. Further, heat or the like is not applicable in the step of curing the adhesive, so that the curing cannot be completed within a short time. Therefore, sufficient care is necessary for conveyance and storage after fitting of an edge protective member.

SUMMARY OF THE INVENTION

An object of the present invention is to prevent the sealing material from peeling from the edge of solar cell module. Another object of the present invention is to prevent rust from appearing at the edge when the steel sheet is used as the support member. A further object of the present invention is to prevent the peeling by a simpler step than the steps in the case of use of the conventional protective member for prevention of peeling.

The present invention provides a solar cell module comprising a solar cell device sealed with a sealing material between a support member and a protective film, wherein the protective film covers the edge of the support member.

DETAILED DESCRIPTION OF THE PREFERRED EMBODIMENTS

Figure 1:
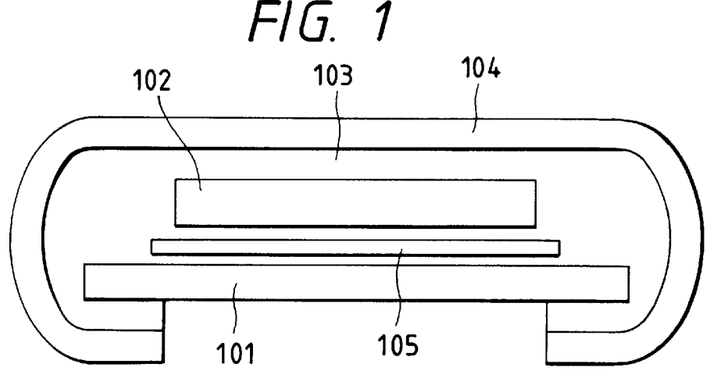
FIG. 1 is a cross-sectional view for showing the solar cell module of the present invention.

FIG. 1 is a schematic, structural view for showing a solar cell module according to the present invention. A solar cell device 102 is sealed with a sealing material 103 of a resin through an insulating member 105 on a support member 101 and the surface is covered with a protective film 104. The protective film 104 and the sealing material 103 are turned to the back of the support member 101 so as to cover the edge of the support member. Otherwise, either the protective film 104 or the sealing material 103 covers the edge of the support member.

This structure achieves the following effects.

(1) It can prevent the peeling at the edge of the solar cell module.

(2) It can prevent the rust at the edge of the solar cell module.

(3) It can obviate the need for the peeling preventing member, etc.

The structure for covering the edge in the covering step has the following effect.

(4) The step of attaching the peeling preventing member to the edge can be eliminated, so as to enhance the productivity of the solar cell module.

Protective Film 104

It is important that the protective film be stable against heat, light, and water (i.e., excellent in weather resistance). The protective film is desirably resistant to contamination so as to prevent decrease in efficiency of solar cell device due to contamination. For this purpose, the protective film is desired to have water repellency.

The water repellency is desired such that a contact angle of water is preferably not less than 50° and more preferably not less than 70°. The protective film is made of fluororesin or silicone resin.

Further, the protective film is preferably one that can be turned back.

In a preferred embodiment, the protective film is made of the fluororesin. Specific examples of the fluororesin are tetrafluoroethylene-hexafluoropropylene copolymer, tetrafluoroethylene-perfluoroalkylvinyl ether copolymer, polychlorotrifluoroethylene, polyvinylidene fluoride, polyvinyl fluoride, ethylene-tetrafluoroethylene copolymer, and ethylene-chlorotrifluoroethylene copolymer. When the protective film is made of one selected from these resins, the protective film is preferably processed by a plasma treatment, a corona discharge treatment, an ozone treatment, or coating of primer in order to assure the adhesion strength to the sealing material.

Sealing Material 103

The sealing material needs to protect the solar cell device from stress or the like from the outside and function to sufficiently transmit rays necessary for photoelectric conversion of the solar cell device. The resin for the sealing material needs to be excellent in transparency, weather resistance, and adhesion. For filling uneven portions on the surface of the solar cell device, it needs to have flowability in the production step of the solar cell module. For example, in the case of the covering step under heat and pressure, the material is selected from thermoplastic resins. Specific materials thereof are ethylene-vinyl acetate copolymer (EVA), polyvinyl butyral, silicone resin, acrylic resin, and so on.

When the adhesion strength of the sealing material is insufficient, the adhesion strength can be increased by also using a silane coupling agent or a titanate coupling agent. An ultraviolet absorbing agent is desirably blended in the aforementioned adhesive resin forming the sealing material so as to provide the sealing material with a desired ultraviolet intercepting function. The ultraviolet absorbing agent used in this case may be either an organic ultraviolet absorbing agent or an inorganic ultraviolet absorbing agent. The sealing material is preferably reinforced in order to increase the mechanical strength. Specific materials are preferably a sealing material in which nonwoven fabric of glass fibers or nonwoven fabric of organic fibers is sealed upon the covering step, and a sealing material in which fillers such as glass staples or glass beads are preliminarily mixed in the resin for the sealing material.

Support Member 101

The support member used in the present invention is selected from steel sheets, glass fiber reinforced plastics, hard plastics, lumber, and so on. In the case of the constructional member integrated with the solar cell module, a preferred structure is such that the edge is bent by folding so as to enhance rigidity and to fit the edge in a channel as a mounting member. Materials suitable for this processing are a steel sheet and a stainless steel sheet. These materials are resistant to melting or deformation under high-temperature flame and are also preferably used as roof members. In such applications, the materials for the support member should be preferably excellent in rust proofing and weather resistance. For attaining the above characteristics, application of a paint with excellent weather resistance is adopted in general.

Edge Structure of Module

Figure 8A:
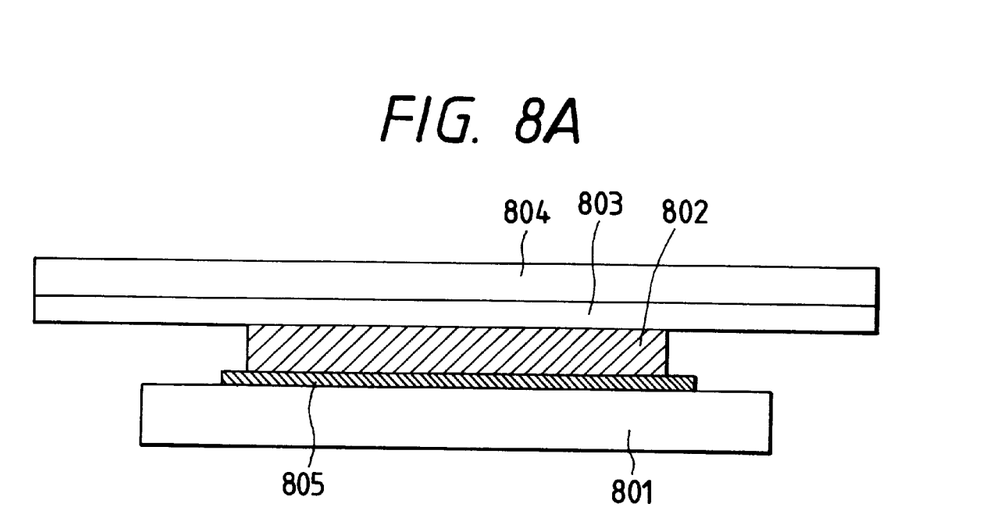
FIGS. 8A and 8B are schematic, structural views for showing a method for producing the solar cell module of the present invention.
Figure 8B:
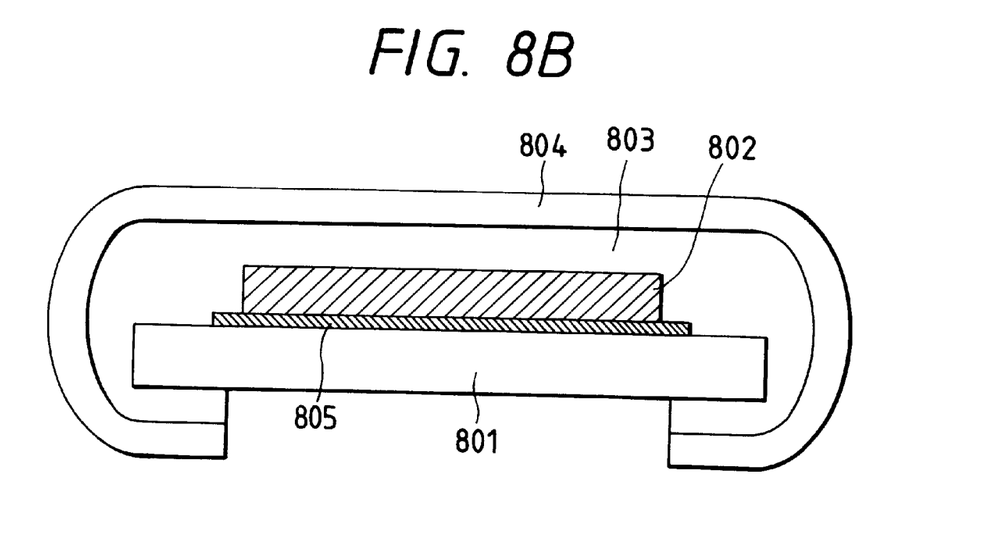

As shown in FIG. 8A, the protective film 804 and sealing material 803 larger in size than the support member 801 are stacked on a solar cell device 802. An insulating member 805 is provided between the solar cell device 802 and the support member 801. In order to change the state as shown in FIG. 8A to the state as shown in FIG. 8B, the protruded portions of the protective film and sealing material outside the support member 801 are turned to the back of the support member. After that, the sealing material is softened by hot pressing to seal the solar cell device 802, thereby achieving the structure for covering the edge of the support member with the protective film and the sealing material, as shown in FIG. 8B.

Solar Cell Device 102

Figure 2:
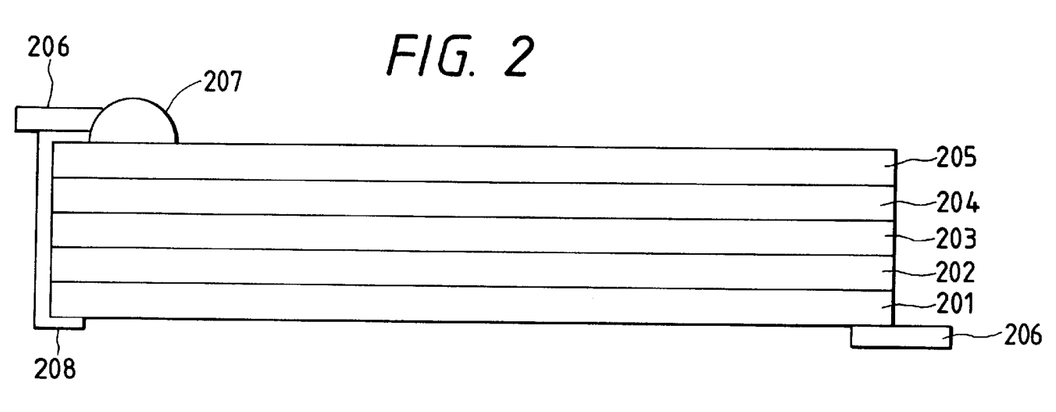
FIG. 2 is a cross-sectional view for showing an example of the solar cell device applicable to the solar cell module of the present invention.

FIG. 2 shows an example of the solar cell device. Reference numeral 201 designates an electroconductive substrate, 202 a back reflecting layer, 203 a semiconductor photoactive layer, 204 a transparent, electroconductive layer, 205 a collector electrode, 206 an output terminal, 207 solder, and 209 an insulating member.

The electroconductive substrate 201 functions as a substrate of the solar cell device and also functions as a lower electrode. The electroconductive substrate 201 may be made of a material selected from the group of silicon, tantalum, molybdenum, tungsten, stainless steel, aluminum, copper, titanium, a carbon sheet, a lead-plated iron sheet, and a resin film and ceramic material having an electroconductive layer formed thereon.

A metal layer, or a metallic oxide layer, or a combination of the metal layer and metallic oxide layer may be formed as the back reflecting layer 202 on the above-stated electroconductive substrate 201. The metal layer is, for example, of Ti, Cr, Mo, W, Al, Ag, Ni or the like, and the metallic oxide layer is, for example, of $ZnO$, $TiO_2$, $SnO_2$ or the like. The metal layer and the metallic oxide layer can be made by a method selected from the resistance heating vapor deposition method, the electron beam vapor deposition method, the sputtering method, and so on.

The semiconductor photoactive layer 203 is a section for undergoing photoelectric conversion. Specific examples of materials for the semiconductor photoactive layer 203 include pn junction type polycrystalline silicon, pin junction type amorphous silicon, and compound semiconductors such as $CuInSe_2$, $CuInS_2$, GaAs, $CdS/Cu_2S$, CdS/CdTe, CdS/InP, and $CdTe/Cu_2Te$. The semiconductor photoactive layer may be made by sheeting of molten silicon or by a heat treatment of amorphous silicon in the case of polycrystalline silicon; or by a plasma enhanced CVD using silane gas and the like as a raw material in the case of amorphous silicon; or by ion plating, ion beam deposition, vacuum vapor deposition, sputtering, or electrodeposition in the case of the compound semiconductors.

The transparent, electroconductive layer 204 serves as an upper electrode of the solar cell device. The transparent, electroconductive layer 204 may be made of a material selected, for example, from $In_2O_3$, $SnO_2$, $In_2O_3$—$SnO_2$ (ITO), ZnO, $TiO_2$, $Cd_2SnO_4$, and crystalline semiconductors doped with a high concentration of impurities. A method for forming the transparent, electroconductive layer 204 may be selected from the resistance heating vapor deposition, sputtering, spraying, CVD, and impurity diffusion methods.

The collector electrode 205 (grid) of a grating pattern may be provided on the transparent, electroconductive layer, for efficiently collecting electric currents. Specific materials for the collector electrode 205 are, for example, electroconductive pastes formed by dispersing fine powder of silver, gold, copper, nickel, carbon or the like in a binder polymer. The binder polymer is selected from polyester, epoxy, acrylic, alkyd, polyvinyl acetate, rubber, urethane, and phenol resins. In addition to the electroconductive pastes, a method for forming the collector electrode 205 may be selected from sputtering, resistance heating and CVD methods using a mask pattern; a method for evaporating a metal film over the entire surface and then removing unnecessary portions by etching to form patterning; a method for directly forming the grid electrode pattern by photo-CVD; and a method for forming a mask of a negative pattern of the grid electrode pattern and then performing plating thereon.

Finally, the output terminals 206 are attached to the conductive substrate and to the collector electrode, for taking out the electromotive force. The output terminal is attached to the electroconductive substrate by a method for bonding a metal member such as a copper tab thereto by spot welding or soldering. The output terminal is attached to the collector electrode by a method for electrically connecting a metal member thereto by an electroconductive adhesive or solder 207. When the output terminal is attached to the collector electrode, the insulating member 209 is desirably provided in order to prevent the output terminal from touching the electroconductive substrate and semiconductor layer to cause short-circuit.

Solar cell devices produced by the above techniques are connected in series or in parallel, depending upon desired voltage or electric current. Another arrangement may be such that solar cell devices are integrated on an insulated substrate to achieve the desired voltage or current.

Insulating Member 105

The insulating member 105 has a function to make insulation surer between the solar cell device and the support member. The other characteristics demanded for the insulating member include electric insulation, mechanical strength, insulation under wet conditions, and heat resistance.

When the adhesion strength of the insulating member is weak to the solar cell device, an adhesive can be used at the interface to the insulating member. The work efficiency can be increased more by the structure in which the adhesive, the insulating member, and the adhesive are preliminarily stacked in an integral form.

The adhesive used in the present invention is desired to have such thermal characteristics of melting at a high temperature and further undergoing crosslinking at a high temperature. However, in applications wherein temperatures of the module are increased to only 80° C. or so, the crosslinking at a high temperature is not so important. The insulating member is preferably made of a material similar to the sealing material.

The insulating member is normally made of a material selected from biaxially oriented polyethylene terephthalate (PET), nylon, and nonwoven fabric of glass fibers or plastic fibers.

Figure 10A:
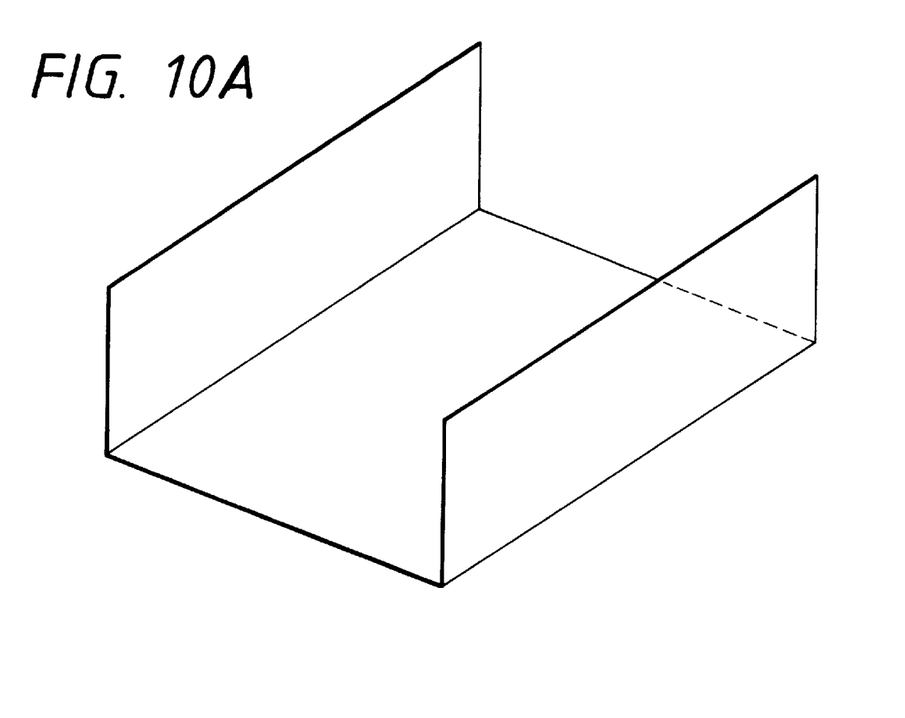
FIGS. 10A and 10B are perspective views for showing examples of the shape of a constructional member integrated with the solar cell according to the present invention.
Figure 10B:
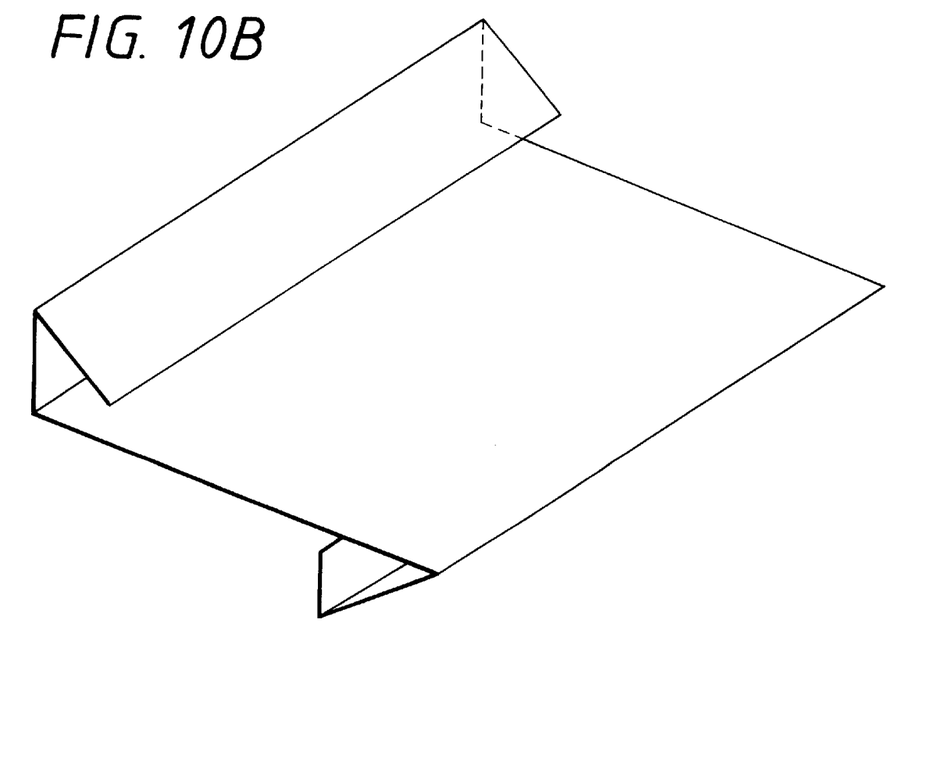

When the solar cell module of the present invention is produced by using the steel sheet for the support member and folding it, it can be suitably applied as a constructional member integrated with a solar cell module. FIGS. 10A and 10B show examples of the shape of a roof member. FIG. 10A shows an example of the batten seam roofing type and FIG. 10B an example of the horizontal roofing type. They are used with an inverter, thus constituting a sunlight-utilizing electric power generation apparatus.

EXAMPLE 1

Figure 3A:
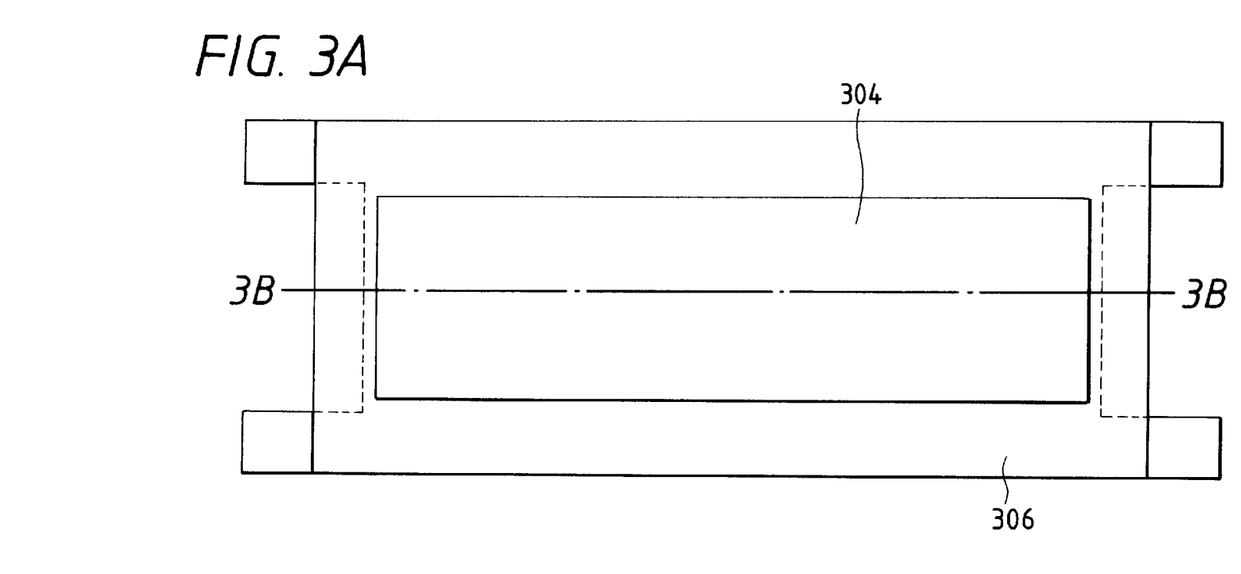
FIG. 3A is a plan view for showing the solar cell module of each of Examples 1, 2 and 3.
Figure 3B:
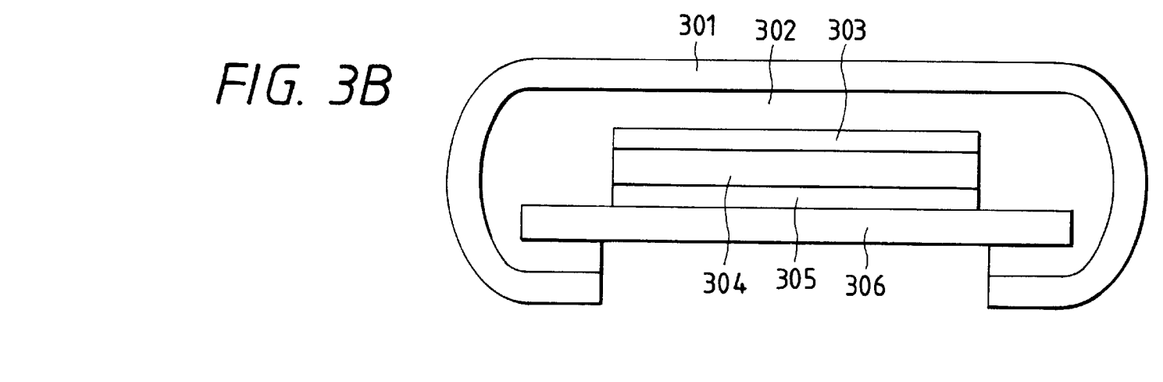
FIG. 3B is a cross-sectional view taken along the line 3B—3B of FIG. 3A.

As shown in FIGS. 3A and 3B, a protective film 301, a sealing material 302, a glass-fiber nonwoven fabric 303, a solar cell device 304, an insulating member 305, and a support member 306 were prepared as mentioned below and these were stacked on the support member to produce a solar cell module.

Support Member

The support member 306 prepared was a galvanized steel sheet (Hardwearing color GL 0.4 mm thick, produced by Daido Kohan).

Production of the Sealing Material

The sealing material 302 was prepared by mixing 100 parts by weight of ethylene-vinyl acetate (vinyl acetate 33% by weight, melt flow rate 30), 1.5 parts by weight of 2,5-dimethyl-2,5-bis(t-butylperoxy)hexane as a crosslinking agent, 0.3 part by weight of 2-hydroxy-4-n-octoxybenzophenone as an UV absorber, 0.2 part by weight of tris(mono-nonylphenyl)phosphate as an antioxidant, and 0.1 part by weight of (2,2 6,6-tetramethyl-4-piperidyl) sebacate as a light stabilizer, and forming a sheet 460 $\mu$m thick by use of T die and extruder. This sheet of the sealing material softens when heated.

Insulating Member

The insulating member 305 was prepared by laying a layer of the same resin as the sealing material in the thickness of 200 $\mu$m on each of the both surfaces of biaxially oriented polyethylene terephthalate film (Tetron S 50 $\mu$m thick, available from Teijin LTD.) the both surfaces of which were corona-treated.

Solar Cell Device

Figure 9A:
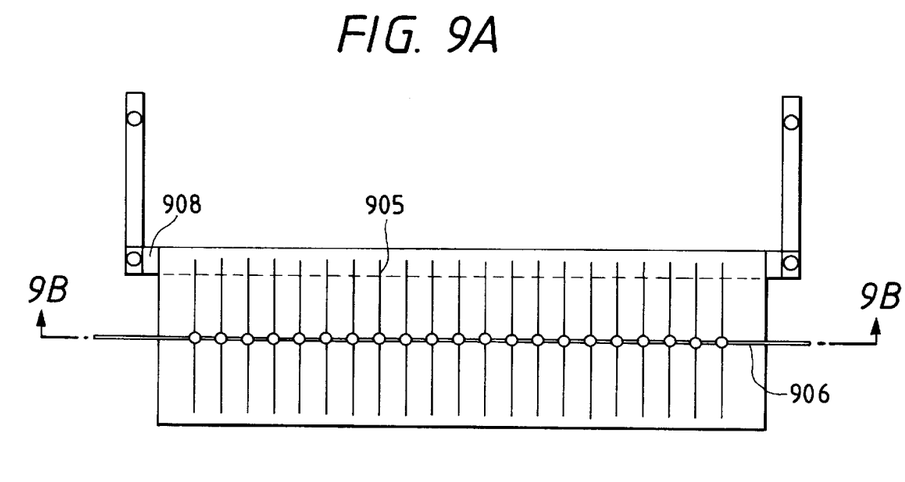
FIG. 9A is a plan view for showing the solar cell device of Example 1.
Figure 9B:
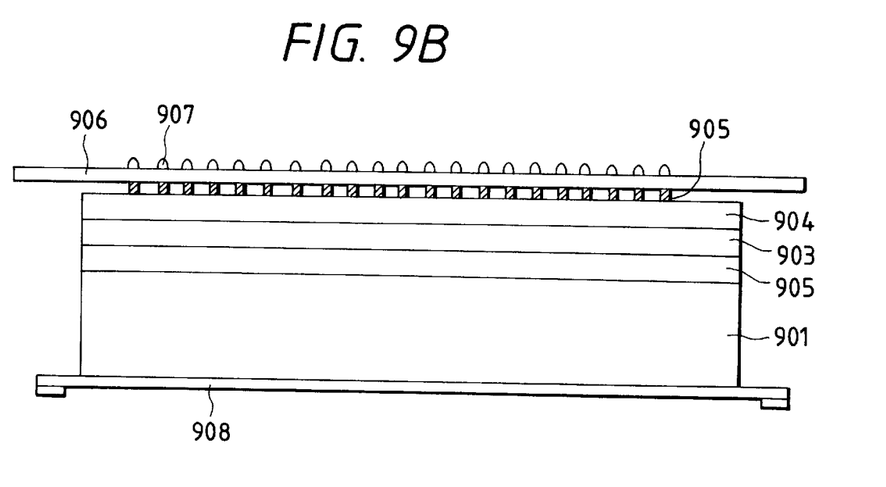
FIG. 9B is a cross-sectional view taken along the line 9B—9B of FIG. 9A.

The solar cell device 304 having the structure shown in FIGS. 9A and 9B was produced in the following manner. First, a beltlike stainless-steel substrate 901 cleaned was prepared, and on the substrate an Al layer (5000 Å thick) and a ZnO layer (5000 Å thick) were successively formed as a back reflecting layer 902 by sputtering. Then, by the plasma enhanced CVD method, an n-type amorphous silicon layer was formed by using a gas mixture of $SiH_4$, $PH_3$, and $H_2$, an i-type amorphous silicon layer was formed by using a gas mixture of $SiH_4$ and $H_2$, and a p-type microcrystalline silicon ($\mu$c-Si) layer was formed by using a gas mixture of $SiH_4$, $BF_3$, and $H_2$ to form a tandem type amorphous silicon photoelectric conversion semiconductor layer 903 in the layer structure of n-type layer 150 Å thick/i-type layer 4000 thick/p-type layer 100 thick/n-type layer 100 Å thick/i-type layer 800 Å thick/p-type layer 100 Å thick. Then the transparent, electroconductive layer 904 was obtained by evaporating In under $O_2$ atmosphere by the resistance heating method to form an $In_2O_3$ thin film (700 Å thick). The obtained body was cut and then etched by screen printing, thus obtaining a plurality of the devices in the size of 30 cm×9 cm. Thirteen devices were selected out of the plurality of the obtained devices and for each of them, grid electrodes 905 for collection of electricity were formed by screen printing with a silver paste (trade number: #5007, produced by DuPont Inc.). Then collector electrodes were connected by bonding a wire busbar 906 (solder-plated copper wire having the diameter of 400 µm) thereto with a silver paste 907 (trade number: #220, produced by Amicon). Further, a copper tab 908 (100 µm thick) was attached to the stainless steel substrate by spot welding, thus obtaining the solar cell device. The solar cell device 304 was prepared as described above.

Protective Film

The protective film 301 prepared was a non-oriented ethylene-tetrafluoroethylene film (TEFZEL 50 µm thick, produced by DuPont Inc.). The surface of the film to be bonded to the sealing material 302 was preliminarily processed by the plasma treatment.

Glass Nonwoven Fabric

The glass nonwoven fabric 303 prepared was a nonwoven fabric of glass fibers (Glassper GMC-00-040, wire diameter 10 µm, basic weight 40 g/m², produced by Honshu Seishi).

Covering Step

Figure 5:
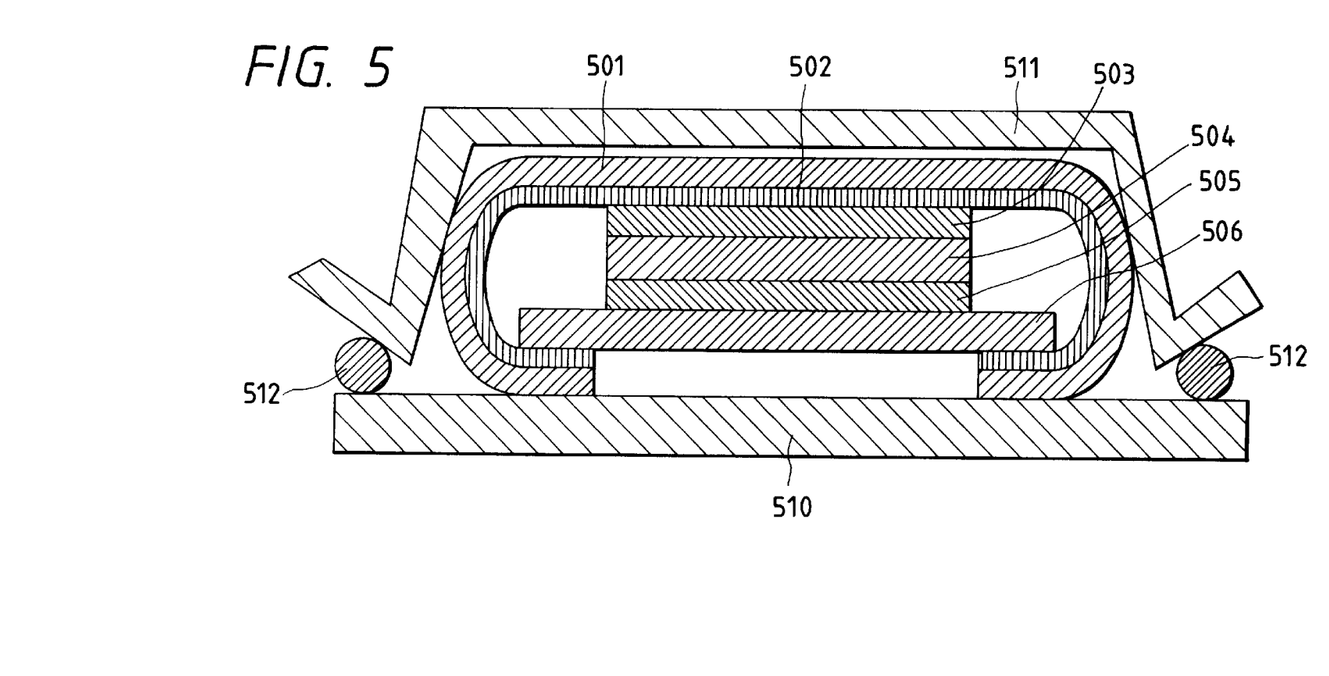
FIG. 5 is a schematic, cross-sectional view for showing the structure of a lamination apparatus.

Hot pressing was performed by using a vacuum lamination apparatus shown in FIG. 5 and the following manner. A PFA film (Teflon PFA 50 µm thick, produced by DuPont Inc.) for prevention of contamination was laid on an aluminum plate 510 (10 mm thick). Stacked thereon were the support member 506, the insulating member 505, the solar cell device 504, the glass nonwoven fabric 503, the sheet of the sealing material 502, and the protective film 501. The sealing material and the protective film were preliminarily scored and their edges were put into between the support member and the PFA film. A sheet 511 (3 mm thick) of heat-resistant silicone rubber was placed on the lamination.

Then the pressure inside the lamination was reduced down to 10 mmHg by a vacuum pump, using O ring 512 as a sealing member. After the pressure was reduced sufficiently, the lamination was put in a hot-air drying furnace at 150° C. while continuously evacuating. The lamination was taken out 100 minutes after. This softened the sheet of the sealing material to seal the solar cell device 504 with the sheet. Then the lamination was cooled down to room temperature while evacuating. A plurality of solar cell device modules as shown in FIGS. 3A and 3B were obtained in this way.

The solar cell modules thus obtained were evaluated by the following methods.

Durability Against Temperature and Humidity Change

The solar cell modules were subjected to 200 cycles of temperature/humidity cycle test of −40° C./one hour and 85° C./85% RH/four hours and thereafter the solar cell modules were evaluated as to their appearance by visual observation. The evaluation result is shown in Table 1, based on the following evaluation criteria. The evaluation criteria were as follows:

⊚: no change in appearance;

○: some change in appearance and some rust observed at the edge of the module; and x: exfoliation occurred at the edge of the sealing material.

High Temperature-High Humidity Test

The solar cell modules were exposed to high temperature and high humidity of 85° C./85% RH/5000 hours. The solar cell modules were then evaluated as to the change in appearance. The evaluation result is shown in Table 1, based on the following evaluation criteria.

The evaluation criteria were as follows:

⊚: no change in appearance;

○: some change in appearance and some rust observed at the edge of the module; and x: exfoliation occurred at the edge of the sealing material.

Salt Spray Test

The salt spray test of 360 cycles defined in JASO M609 was conducted.

One test cycle involves salt spray for two hours, drying for four hours, and wetting for two hours.

The salt spray was carried out at the temperature of 35° C. and the concentration of salt water was 5±0.5%. The drying was done at 60±1° C. and the relative humidity of 20 to 30%. The wetting was done at the temperature of 50±1° C. and the relative humidity of 95% or more. The solar cell modules were evaluated as to the change in appearance. The evaluation result is shown in Table 1, based on the following evaluation criteria. The evaluation criteria were as follows:

⊚: no change in appearance;

○: some change in appearance and some rust observed at the edge of the module; and x: exfoliation occurred at the edge of the sealing material.

Time Necessitated for the Process to Prevent Peeling at the Edge

The time necessitated for the process to prevent peeling at the edge was measured. The evaluation result was expressed by minutes of the time necessitated for production of one module.

EXAMPLE 2

The solar cell modules were produced in the same manner as in Example 1 except that an acrylic resin film (PMMA 50 µm) was used in place of the ethylene-tetrafluoroethylene copolymer film (ETFE 50 µm) used in Example 1. The evaluation results are shown in Table 1.

EXAMPLE 3

The solar cell modules were produced in the same manner as in Example 2 except that a fiber reinforced plastic (FRP) film (2 mm) was used as the support member in place of the galvanized steel sheet used in Example 2. The evaluation results except for the salt spray test are shown in Table 1. Since the FRP film used as the support member does not rust, the salt spray test was not conducted.

EXAMPLE 4

Figure 4:
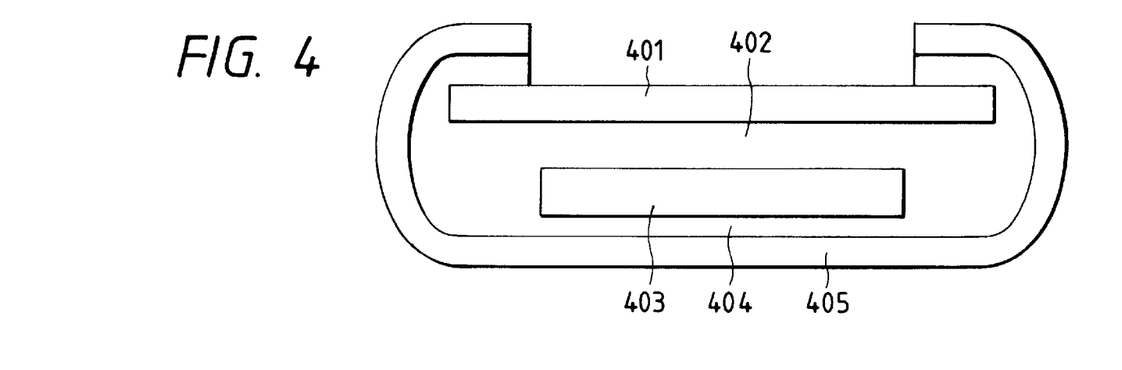
FIG. 4 is a cross-sectional view for showing the solar cell module of Example 4.

As shown in FIG. 4, a glass 401, a sheet of a sealing material 402, a solar cell device 403, a sheet of a sealing material 404, and a back film 405 were prepared as mentioned below and they were stacked on the support plate. Then they were hot-pressed to produce the solar cell module. Since the glass 401 used as the support member does not rust, the salt spray test was not conducted.

Glass

The glass 401 prepared was white sheet glass (3.3 mm).

Sheet of the Sealing Material

The sheet of the sealing material was the same as that of Example 1.

Solar Cell Device

The solar cell device was the same as that in Example 1.

Back Film

The back film prepared was an aluminum sheet (120 μm) the both surfaces of which were coated with PVF.

Covering Step

A PFA film (Teflon PFA 50 μm thick, produced by DuPont Inc.) for prevention of contamination was laid on the aluminum plate 501 (10 mm thick), and the glass 401, the sheet of the sealing material 402, the solar cell device 403, the sheet of the sealing material 404, and the back film 405 prepared as described above were stacked thereon. The sealing material and the back film were preliminarily scored and the edges thereof were put into between the support member and the PFA film. The sheet 502 of heat-resistant silicone rubber (3 mm thick) was laid on the lamination. Then the pressure inside the lamination was reduced down to 10 mmHg by the vacuum pump, using the O ring 503 as a sealing member. After the pressure was reduced sufficiently, the lamination was put in the hot-air drying furnace at 150° C. while evacuating. The lamination was taken out 100 minutes after. Then the lamination was cooled down to room temperature while evacuating. A plurality of solar cell modules were obtained in this way. The evaluation results except for the salt spray test are shown in Table 1.

COMPARATIVE EXAMPLE 1

The solar cell modules were produced in the same way as in Example 1 except that the protective film and the sealing material had the same size as the support member and thus they were not turned to the back of the support member. The evaluation results are shown in Table 1.

COMPARATIVE EXAMPLE 2

The solar cell modules were produced in the same manner as in Comparative Example 1 except that the peeling preventing member was attached to the edge of the solar cell module as follows. The peeling preventing member was attached to the edge of the solar cell module in the following procedures.

1. A silicone sealant was applied to the peeling preventing member of an U-shaped and painted steel plate.

2. The peeling preventing member was engaged with the solar cell module and then it was confirmed that unnecessary amount of the silicone sealant was protruded on the surface of all the engaged portions.

3. The unnecessary amount of the silicone sealant was wiped out. Then, the peeling preventing member was fixed to the solar sell module at two positions by an adhesive tape until the silicone sealant cured so that the peeling preventing member was not slipped from the solar cell module.

Further, the other edge opposite to the edge of the solar cell module was also engaged with the peeling preventing member in the above procedures. The evaluation results are shown in Table 1.

TABLE 1

| | Durability against temperature and humidity change | High temperature/ high humidity test | Salt spray test | Time for production of one module (min) |
|---|---|---|---|---|
| Example 1 | ⊚ | ⊚ | ⊚ | 5 |
| Example 2 | ⊚ | ⊚ | ⊚ | 5 |
| Example 3 | ⊚ | ⊚ | — | 5 |
| Example 4 | ⊚ | ⊚ | — | 5 |
| Comp. Ex 1 | ○ | ○ | x | 5 |
| Comp. Ex 2 | ○ | ○ | ○ | 15 |

What is claimed is:

1. A solar cell module comprising a solar cell device sealed with a sealing material between a support member and a protective film, wherein at least one of the protective film and the sealing material covers the edge of the support member.

2. A solar cell module according to claim 1, wherein the protective film covers a part of the back surface of the support member via the edge of the support member.

3. A solar cell module according to claim 1, wherein the sealing material covers a part of the back surface of the support member via the edge of the support member.

4. A solar cell module according to claim 1, wherein the support member is a metal, a glass fiber reinforced plastic, a hard plastic, a lumber material, or a glass material.

5. A solar cell module according to claim 1, wherein an insulating member is provided between the support member and the solar cell device.

6. A solar cell module according to claim 5, wherein the insulating member is PET, nylon, glass fibers, or plastic fibers.

7. A solar cell module according to claim 1, wherein the solar cell device comprises a non-single-crystal silicon semiconductor.

8. A solar cell module according to claim 1 wherein the protective film covers a portion of the back surface of the support member from the edge of the support member to a surface of the support member adjacent the solar cell device.

9. A solar cell device according to claim 1 wherein the protective film covers a light incident side of the solar cell device.

10. A method of producing a solar cell module, comprising the steps of sandwiching at least a solar cell device and a sealing member between a support member and a protective film, turning back the protective film via the edge of the support member to cover at least a part of the support member, and hot-pressing the obtained lamination.

11. A method of producing a solar cell module according to claim 10, further comprising a step of bending the support member.

12. A constructional member integrated with a solar cell module comprising a solar cell device sealed with a sealing material between a support member and a protective film, wherein at least one of the protective film and the sealing material covers the edge of the support member.

13. A constructional member integrated with a solar cell module according to claim 12, wherein a part of the support member is bent.

14. A sunlight-utilizing electric power generation apparatus comprising: a solar cell module comprising a solar cell device sealed with a sealing material between a support member and a protective film, wherein at least one of the protective film and the sealing material covers the edge of the support member; and an inverter for controlling an output from the solar cell module.

* * * * *

UNITED STATES PATENT AND TRADEMARK OFFICE
CERTIFICATE OF CORRECTION

PATENT NO. : 6,034,323

DATED : March 7, 2000

INVENTOR(S) : SATORU YAMADA, ET AL.

Page 1 of 2

It is certified that error appears in the above-identified patent and that said Letters Patent is hereby corrected as shown below:

COLUMN 4:

Line 32, "transparent," should read --transparent--;
    Line 46, "is," should read --is made,--;
    Line 48, "is," should read --is made,--; and
    Line 57, "pn" should read --pin--.

COLUMN 6:

Line 36, "phosphate" should read --phosphite--;
    Line 37, "(2,2 6,6-tetramethyl" should read --(2,2,6,6-tetramethyl--;
    Line 45, "the" should be deleted;
    Line 47, "the" should be deleted;
    Line 54, "substrate 901 cleaned" should read --clean substrate 901--;
    Line 65, "4000" should read --4000 Å--; and
    Line 66, "100" should read --100 Å--.

COLUMN 7:

Line 41, "into" should be deleted.

UNITED STATES PATENT AND TRADEMARK OFFICE
CERTIFICATE OF CORRECTION

PATENT NO. : 6,034,323

DATED : March 7, 2000

INVENTOR(S) : SATORU YAMADA, ET AL.

It is certified that error appears in the above-identified patent and that said Letters Patent is hereby corrected as shown below:

COLUMN 9:

Line 20, "the" should be deleted;
    Line 30, "into" should be deleted;
    Line 59, "an" should read --a--; and
    Line 62, "protruded" should read --protruding--.

Signed and Sealed this

Third Day of April, 2001

*Attest:*

NICHOLAS P. GODICI

*Attesting Officer*    Acting Director of the United States Patent and Trademark Office